United States Patent [19]

Eitan

[11] Patent Number: 5,783,964
[45] Date of Patent: Jul. 21, 1998

[54] BACKUP BATTERY SWITCH WITH FIRST POWER UP CONTROL

[75] Inventor: Boaz Eitan, Ra'anana, Israel

[73] Assignee: Waferscale Integration, Inc., Fremont, Calif.

[21] Appl. No.: 749,616

[22] Filed: Nov. 18, 1996

[51] Int. Cl.[6] .................................................. H03K 17/62
[52] U.S. Cl. ........................ 327/408; 327/70; 327/99; 327/143
[58] Field of Search ....................... 307/64; 324/433; 327/63, 70, 99, 407, 408, 545, 546, 142, 143, 199

[56] References Cited

U.S. PATENT DOCUMENTS

| 4,617,473 | 10/1986 | Bingham | 307/66 |
|---|---|---|---|
| 4,654,829 | 3/1987 | Jiang et al. | 365/229 |
| 4,730,121 | 3/1988 | Lee et al. | 307/66 |
| 4,908,790 | 3/1990 | Little et al. | 364/900 |
| 5,237,699 | 8/1993 | Little et al. | 395/750 |
| 5,272,393 | 12/1993 | Horiguchi et al. | 307/296 |
| 5,315,549 | 5/1994 | Scherpenberg et al. | 365/189.09 |
| 5,557,229 | 9/1996 | Eitan | 327/374 |

Primary Examiner—Timothy P. Callahan
Assistant Examiner—Jeffrey Zweizig
Attorney, Agent, or Firm—Skjerven, Morrill, MacPherson, Franklin & Friel LLP

[57] ABSTRACT

A switching circuit for switching between a main power supply and a battery power supply only after first power up includes a switch, a first power up transfer transistor and a first power up latch. The switch switches between the main and battery power supplies and provides one of the main and battery power supplies to a switched power supply node. The first power-up transfer transistor is connected on input to the switched power supply node. The first power up latch is powered by a switched power supply from the switched power supply node and is connected on output to a gate of the first power-up transfer transistor. The first power up latch produces an activation signal to the gate upon and after first power up of the main power supply.

3 Claims, 5 Drawing Sheets

BACKUP BATTERY SWITCH WITH FIRST POWER UP CONTROL

CROSS REFERENCE TO RELATED FILES

This application is related to the following patent applications, all filed on the same day herewith and assigned to the common assignee of the present invention: Ser. No. 08/749,615, entitled "Unit for Maintaining Information Regarding the State of a Device During Battery Power", Ser. No. 08/749,617, entitled "Battery Backed Configurable Output Buffer", Ser. No. 08/749,618, entitled "Backup Battery Switch".

FIELD OF THE INVENTION

The present invention relates generally to circuits for switching between a main power supply and a backup battery power supply and to such circuits which provide power only after first power up by the main power supply.

BACKGROUND OF THE INVENTION

Integrated circuits require a power supply to operate. When the circuit is not operating, the power supply is typically shut off. However, there are certain circuit elements for whom some level of power (such as battery power) is required at all times, even if the main power is shut down. For example, volatile random access memory (RAM) arrays, also known as "static RAMs" or SRAMs require some power to maintain the information stored therein, if such is necessary.

Power supply switches which select between a main power supply and a battery backup supply are well known in the art. These switches continually compare the voltage levels of the two supplies and switch to the battery supply when the voltage of the main power supply falls below the level of the battery supply. The switch switches to the main supply once its voltage level is above that of the battery supply.

For example, U.S. Pat. No. 4,730,121 to Lee et al. describes one battery backup switching circuit which, in addition to the switching circuit, includes circuitry for receiving a reset or isolation signal. If the isolation signal is active, when the main power fails, the circuit will be isolated from both power sources.

U.S. Pat. No. 5,315,549 to Scherpenberg et al. describes a memory controller which supplies backup battery power when the main power supply fails.

There are some logic elements, particularly those of the switching circuit and often other elements as well, which must continually receive some level of power. The switching circuit elements require the power in order to independently determine when the main power has returned. The other logic elements may require power in order to provide logic signals during battery power operation.

Unfortunately, the continually operative logic elements continually pull power from the battery, reducing the life of the battery. Accordingly, integrated circuit designers work to reduce the number of parts which utilize battery power.

It is possible that the part with the VLSI circuit will operate on battery power for a significant length of time, particularly when the part is stored in inventory, prior to be used for the first time. The battery might then be significantly rundown even before the part is ever utilized.

U.S. Pat. No. 4,908,790 to Little et al. describes a backup battery switching circuit which selectively connects the backup battery only when it is desired to preserve the data in the RAM. The microcomputer to which the RAM is connected controls the switching circuit of Little et al. and commands whether or not the backup battery is to be utilized.

SUMMARY OF THE PRESENT INVENTION

It is an object of the present invention to provide a unit for passing a switched power supply only after first power-up of the main power supply.

There is provided, in accordance with a preferred embodiment of the present invention a switching unit. The unit includes a switch, a first power-up transfer transistor and a first power up latch. The first power up latch produces an activation signal to the gate of the first power-up transfer transistor only after first power up of the main power supply.

Further, in accordance with a preferred embodiment of the present invention, the first power up latch includes a latch, a controlling transistor and a capacitor. The capacitor is connected to the latch so as to force its output to be high, no matter what state the initial input is. The controlling transistor is connected to an input node of the latch and provides an activation signal during power up of the main power supply. In response to the activation signal, the latch changes its output to a low voltage level and maintains that low voltage level output even when the main power supply falls.

BRIEF DESCRIPTION OF THE DRAWINGS

The present invention will be understood and appreciated more fully from the following detailed description taken in conjunction with the drawings in which:

FIG. 6 is a circuit diagram illustration of the power up latch of FIG. 5.

DETAILED DESCRIPTION OF A PREFERRED EMBODIMENT

Figure 1:
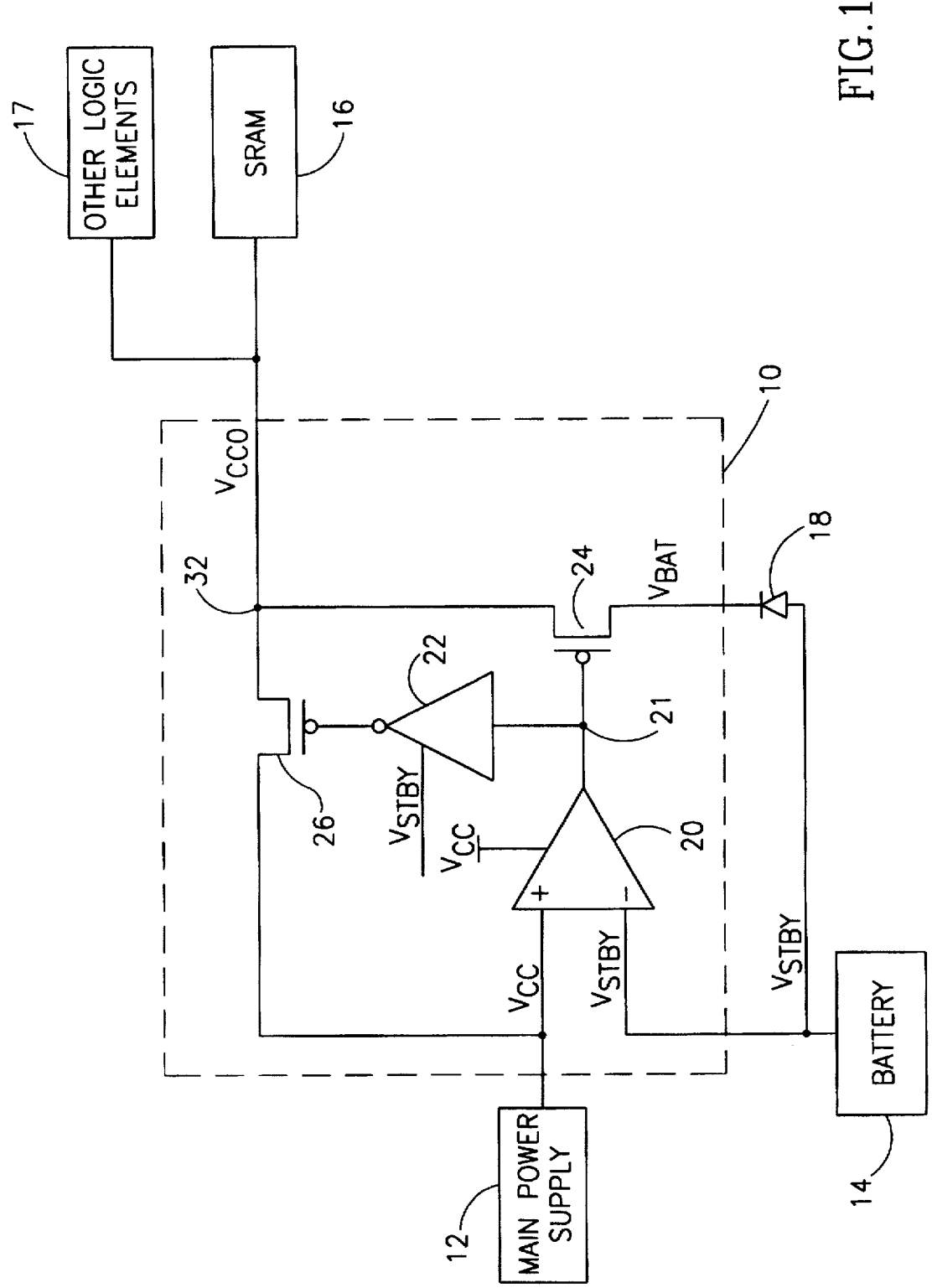
FIG. 1 is a general circuit diagram illustration of a backup battery switch, constructed and operative in accordance with a preferred embodiment of the present invention.

Reference is now made to FIG. 1 which illustrates the backup battery switch 10 of the present invention within a VLSI circuit. Thus, FIG. 1 shows switch 10 receiving power from a main power supply 12 and from a battery 14 and providing a switched power supply signal, labeled Vcco, to a static random access memory (SRAM) array 16 and to other logic elements 17. The main power supply 12 supplies the main power signal Vcc and the battery 14 provides two supply signals, Vstby and Vbat. The backup battery switch 10 switches to the Vbat power supply when the variable voltage level of the main supply Vcc falls below the fixed voltage level Vstby of the battery.

It is noted that the Vbat signal is isolated from the battery 14 by a diode 18. This protects the battery 14 from possible shorting due to activity of the logic elements 17 and ensures that battery 14 does not receive an overvoltage when the main power supply Vcc rises higher than the battery power supply Vbat but the switch 10 has not yet switched to the main power supply Vcc.

The switch 10 comprises a comparator 20, having an output node 21, an inverter 22, a battery power transfer switch 24 and a main power transfer switch 26. Inverter 22 and power transfer switch 24 are both connected to node 21. The power transfer switches 24 and 26 are p-channel transistors (i.e. active low) whose output lines are connected together at node 32, thereby to create switched power supply Vcco. The input to battery power transfer switch 24 is the Vbat power supply and the Input to main power transfer switch 26 is the main power supply Vcc. Thus, Vcco will be equal to Vcc when main power transfer switch 26 is active and equal to Vbat when battery power transfer switch 24 is active.

Comparator 20 compares the voltage levels of the variable main supply Vcc with the fixed battery supply Vstby and, in accordance with a preferred embodiment of the present invention, operates solely on main power supply Vcc. To do so, comparator 20 ensures that its selection signal to node 21 is at a zero voltage if the battery supply Vstby is higher than the main supply Vcc and a high value otherwise. Comparator 20 also has a low power override circuit which forces the selection signal to stay at zero voltage for the entire period that the main power supply Vcc is below a minimum operating voltage Vmin below which none of the CMOS elements of comparator 20 will work predictably. The minimum operating voltage Vmin is typically higher than the sum of the threshold levels of the n-channel and p-channel transistors, each of which is typically 0.8 V. Thus Vmin is typically 1.8–2 V.

Because of the polarity of node 21, battery power transfer switch 24 is controlled directly by node 21 and main power transfer switch 26 is controlled by inverter 22 which inverts the signal at node 21. Accordingly, a low value at node 21 activates battery power transfer switch 24 to provide the Vbat power supply to node 32. At the same time, the inverter 22 deactivates main power transfer switch 26, preventing the transfer of the Vcc power supply. The opposite is true for a high voltage level at node 21 which deactivates battery power transfer switch 24. The inverter 22 activates main power transfer switch 26 which, in turn, transfers the Vcc power supply to node 32.

It will be appreciated that operating comparator 20 on the main power supply Vcc minimizes the amount of battery power wasted for determining when to switch back to main power. It will further be appreciated that the inverter 22 must be operated on battery power Vstby to ensure that the power transfer switch 26 for the main power supply Vcc remains disconnected during battery operation. However, inverter 22 dissipates little power except for its direct leakage current. This is in contrast to the power dissipation of comparator 20 which, when active, utilizes significant amounts of power.

Figure 2:
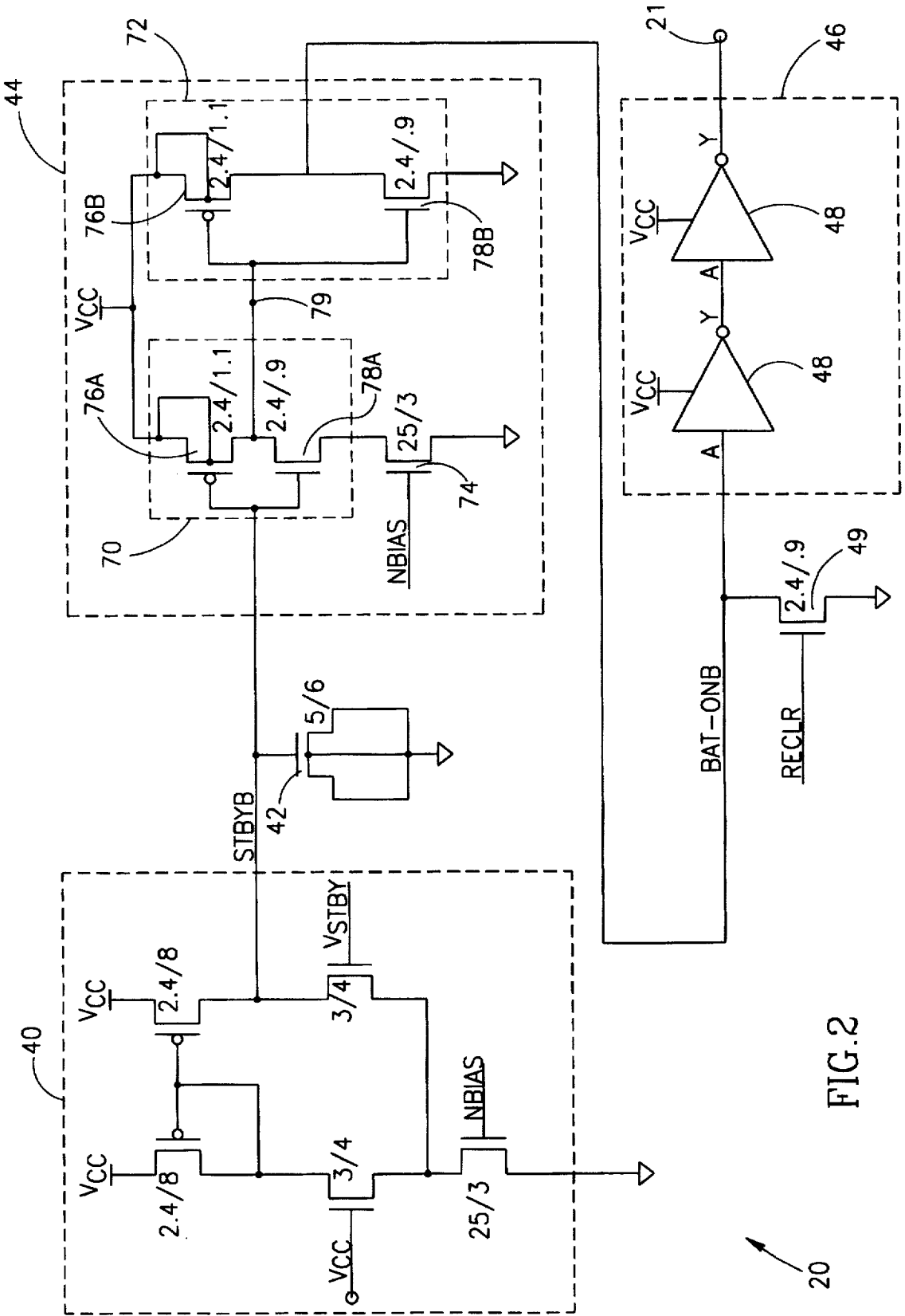
FIG. 2 is a circuit diagram illustration of a comparator, useful in the switch of FIG. 1.

Reference is now made to FIG. 2 which details the elements of comparator 20. Comparator 20 comprises a differential sense amplifier 40, a capacitor 42, a break before make switch 44, an override pull-down transistor 49 and a driving buffer 46, all of whom operate on the main power supply Vcc.

The differential sense amplifier 40 is a standard differential sense amplifier biased by an "nbias" voltage and is well understood by those skilled in the art. The nbias voltage is a reference voltage close to the threshold level Vtn of the n-channel transistors. It is created with a current source and an n-channel transistor operating as a diode.

Amplifier 40 produces a stbyb signal which is high when the main power supply Vcc is high and low when the battery power supply Vstby is high. To minimize oscillations, amplifier 40 is a relatively low gain unit.

The capacitor 42 is connected to the line which carries the stbyb signal and ensures that the stbyb signal changes state relatively slowly. For example, if the Vcc supply is oscillating around voltage levels close to the Vstby supply, the capacitor 42 will smooth the oscillations.

The break before make switch 44, detailed hereinbelow, is a high gain circuit which amplifies the stbyb signal ensuring that the output signal, called "bat_onb", has significantly large swings to differentiate between the battery on state (when bat_onb is low) and the main power on state (when bat_onb is high). Since the voltage levels are significantly separated, the break before make switch 44 ensures that only one of the two power transfer switches 24 and 26 is activated at a time. By forcing the bat_onb signal to have large swings, break before make switch 44 helps to ensure that the bat_on signal has a significantly low voltage level as the main power supply Vcc begins to fall below the battery power supply voltage level Vstby.

However, the break before make switch 44 only operates while the main power supply Vcc is above the minimum operating voltage Vmin. For very low power operation, override pull-down transistor 49 maintains the bat_onb signal at a zero voltage value.

Override pull-down transistor 49 is active only while the voltage level of the main power supply Vcc is close to or below the minimum operating voltage Vmin. For example, pull-down transistor 49 might be active until the main power Vcc achieves a voltage of 1.8 V or 2 V (by comparison, Vstby is 2.7 V). While pull-down transistor 49 is active, it overrides the actions of differential sense amplifier 40 and break before make switch 44 (which are not working predictably due to the low voltage level of the main power supply Vcc) and forces the bat_onb signal to the zero voltage level. This maintains the high gain of comparator 20 even during very low power. Furthermore, during power up, pull-down transistor 49 protects against power-up glitches by maintaining the bat_onb signal at the zero voltage level until the main power supply Vcc has achieved a significant voltage level.

The buffer 46, comprised of two inverters 48, provides the strength to drive the p-channel transistor 24 since the exemplary break before make switch 44 has low current drive.

It will be appreciated that, due to the actions of break before make switch 44, the bat_onb signal has a zero voltage value shortly after the main power supply falls below the battery voltage level Vstby. Due to the override, pull-down transistor 49, the zero voltage value is maintained while the main supply has low power. Thus, comparator 20 can operate properly on the variable main supply Vcc.

The operation of break before make switch 44 and pull-down transistor 49 will now be detailed.

The break before make switch 44 comprises two inverters 70 and 72 connected in series and a leaker transistor 74 connected to the first inverter 70 and controlled by the fixed nbias signal. Each inverter, labeled "A" and "B" respectively, comprises a p-channel transistor 76 and an n-channel transistor 78.

Leaker transistor 74 limits the amount of current which can flow and forces the trip voltage at which the n-channel transistor 78A begins to conduct to be close to full Vcc level. Thus, when stbyb has a voltage other than close to full Vcc, p-channel transistor 78A conducts and controls node 79, providing it with a high voltage level. When stbyb has a voltage of close to Vcc, p-channel 76A is off and n-channel transistor 78A is on, pulling node 79 to towards ground. Node 79 thus swings between standard low and high voltage levels and thus, inverter 72 operates properly, providing the bat_onb signal with CMOS high and low voltage levels.

It will be appreciated that break before make switch 44 produces a high signal only once p-channel transistor 76A is fully shut off. Thus, break before made switch 44 ensures that the bat_onb signal is at a standard low voltage level whenever the main power supply 12 is close to or below the voltage level Vstby of the battery power supply 14.

As mentioned hereinabove, pull-down transistor 49 serves to override the actions of differential amplifier 40 and break before make switch 44, forcing the bat_onb signal to stay at the zero voltage level while the main power supply Vcc has too low a voltage level. This ensures that the bat_onb signal will be zero while the main power supply Vcc is off. Pull-down transistor 49 is connected between the bat_onb line and ground and is controlled by an recir signal.

Figure 3:
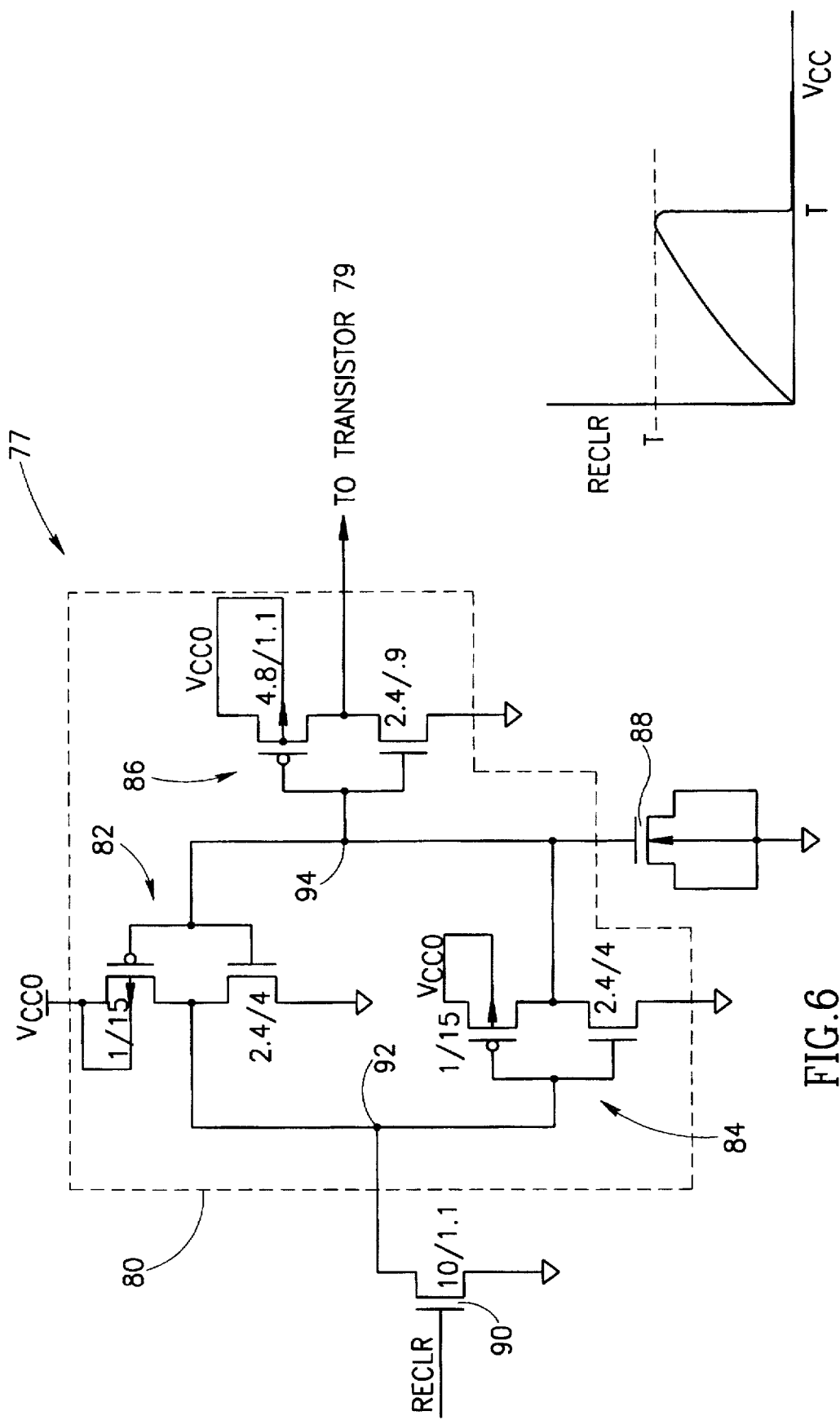
FIG. 3 is a graphical illustration of an input signal utilized in the battery backup switch of FIG. 1.

FIG. 3, to which reference is now briefly made, illustrates the recir signal. As shown, the recir signal follows the voltage level of the main power supply Vcc until Vcc reaches a certain voltage level T, typically about 2 V, which minimally is larger than Vmin (e.g. equal to the combined threshold voltages of n-channel and p-channel transistors (each about 0.8 v). Above voltage level T, the recir signal drops back to a zero voltage level.

When the main power supply Vcc is fully on, the recir signal is inactive and pull-down transistor 49 does not affect the voltage of the bat_onb signal. As the main power supply Vcc drops below the voltage level T (i.e. when the CMOS transistors are no longer functioning reliably), the recir signal is activated, activating pull-down transistor 49 and forcing the voltage level of the bat_onb signal to zero. Furthermore, upon return of the main power supply Vcc, pull-down transistor 49 ensures that the bat_onb signal stays at zero until the main power supply Vcc is large enough, thereby preventing glitches.

Figure 4:
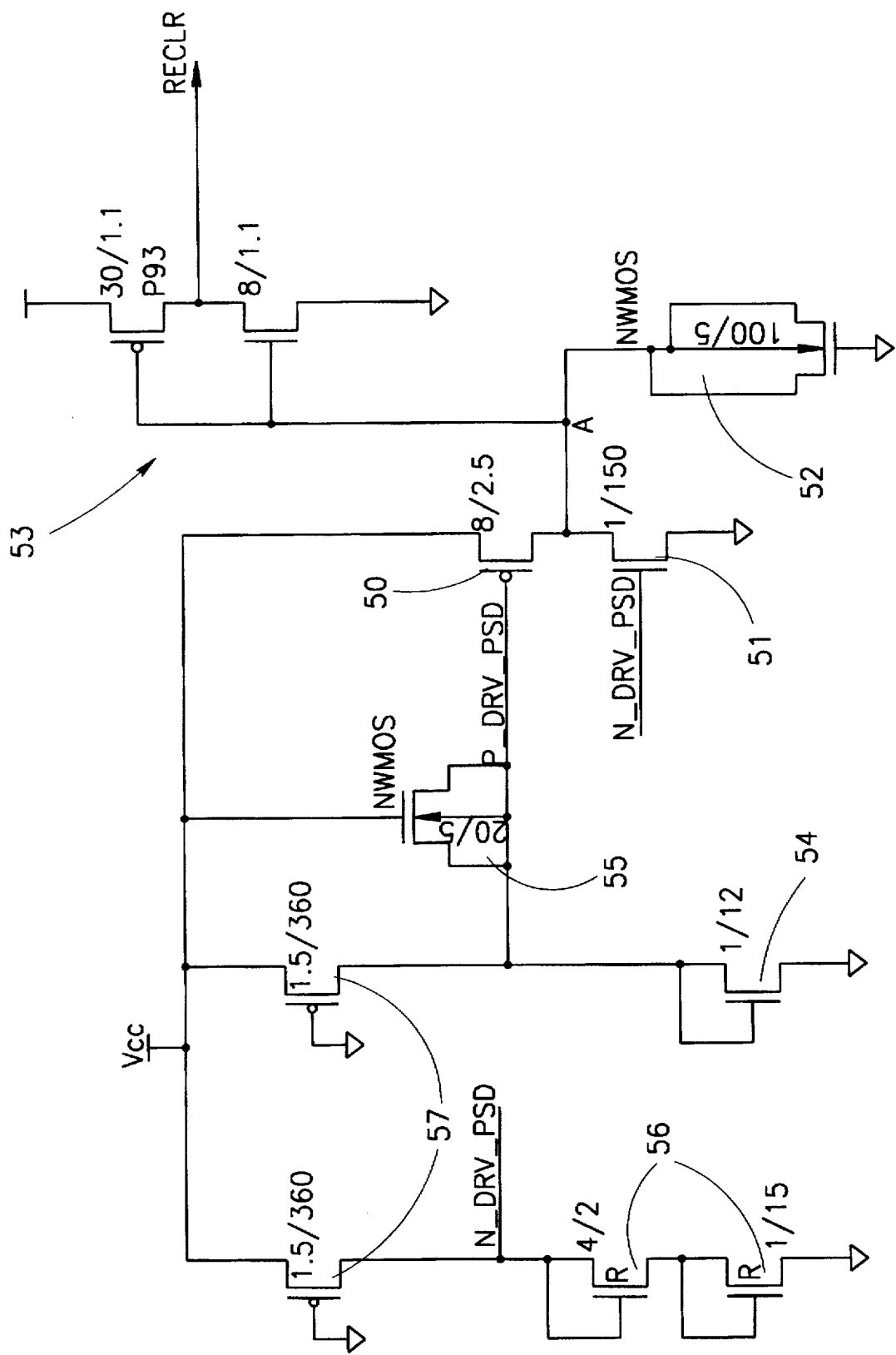
FIG. 4 is a circuit diagram illustration of a circuit for producing an recir signal, useful in the comparator of FIG. 2.

Reference is now briefly made to FIG. 4 which illustrates the circuit which produces the recir signal. The circuit comprises a pull-up p-channel transistor 50, a leaker transistor 51, a capacitor 52, an inverter 53, a diode-connected n-channel transistor 54 and a second capacitor 55.

Diode-connected transistor 54 produces a relatively steady signal, p_drv_psd, whose voltage level is just above the threshold level Vtn of transistor 54. The signal p_drv_psd controls pull-up transistor 50 which receives, at its source, the main power supply Vcc. Its drain is connected to a node A which is also the source for leaker transistor 51, a small transistor which continually leaks a small current. Since the signal p_drv_psd is a low signal but not at the logic low level, pull-up transistor 50 begins to conduct only once its source is higher, by the amount of its threshold voltage Vtp, than its control signal p_drv_psd (which is at or close to Vtn). Thus, pull-up transistor 50 begins to conduct when Vcc is higher than Vtp+Vtn (i.e. from 1.8 V–2 V).

Inverter 53 inverts the level of node A, thereby producing the recir signal. Thus, when the main power supply Vcc is below Vtp+Vtn, inverter 53 inverts the low level of node A to the Vcc level. However, since transistor 50 is physically much larger than leaker 51 (for example, transistor 50 might be of size 8/2.5 and leaker 51 of size 1/150), once pull-up transistor 50 conducts, it overcomes the effect of leaker 51 and relatively quickly changes node A to the level of the main supply Vcc. Inverter 53 then inverts the level of node A and produces a zero voltage signal. Thus, the recir signal follows the voltage level of the main power supply Vcc until it reaches a threshold level T which, in this circuit is equal to Vtp+Vtn. Above voltage T, the recir signal drops to the zero voltage level.

The transistors of the circuit of FIG. 4 typically have low leakage currents and, as such, do not respond quickly to rapid transitions of their input signals. Therefore, capacitors 52 and 55 are included to maintain node A and the p_drv_psd signal, respectively, at the desired voltage level during the rapid transition. Capacitor 52 couples node A to ground and capacitor 55 couples the p_drv_psd signal to the main power supply Vcc.

The circuit of FIG. 4 additionally shows two diode-connected n-channel transistors 56 which produce the control signal for leaker transistor 51 and transistors 57 which provide a resistance level to the circuit.

Figure 5:
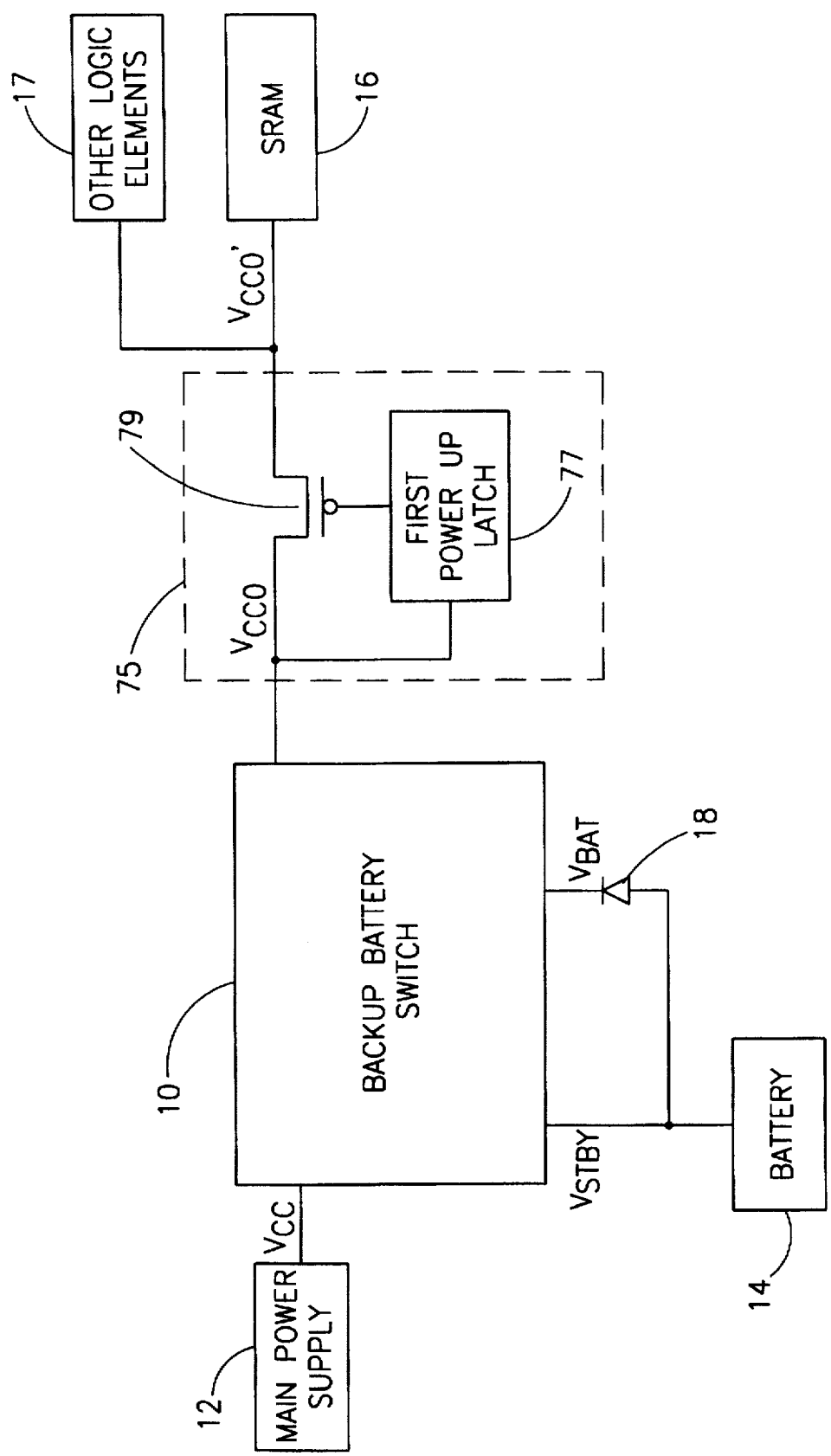
FIG. 5 is a block diagram illustration of a second backup battery switch, constructed and operative in accordance with a second preferred embodiment of the present invention, operative with a power up latch.

Reference is now made to FIGS. 5 and 6 which illustrate an extension to the battery backup switch of FIG. 1. FIG. 5 is a block diagram of the entire backup battery circuit, including a first power up unit 75. FIG. 6 is a circuit diagram of a first power up latch 77 forming part of the power up unit 75.

In the embodiment of FIG. 5, the switched power supply Vcco is provided to the first power up unit 75 which passes the switched power supply Vcco, as supply Vcco', only if the main power supply Vcc has already been powered up once. Otherwise, no power is passed. As a result, when the part in which the circuit of FIG. 5 is incorporated is in inventory and not being used (which can be a significant portion of its lifetime), no battery power is provided to the SRAM 16 or to the logic elements 17. Battery power is provided, of course, to the elements of the backup battery switch 10.

It will be appreciated that the first power up unit 75 reduces the amount of battery power utilized during periods when the main power supply Vcc has not yet been activated. Thus, a part having the switch of FIG. 5 can be assembled with its battery and can be left in inventory for a significant length of time.

As shown in FIG. 5, the first power up unit 75 comprises a first power up latch 77 and a first power up transfer switch 79, wherein the first power up latch 77 controls the first power up transfer switch 79, only activating switch 79 when main power supply Vcc is applied for the first time. It is noted that the first power up latch 77 is powered by the switched Vcco signal and that first power up transfer switch 79 is a p-channel transistor.

FIG. 6 illustrates the elements of latch 77 which comprises a standard latch 80 utilizing the switched power supply Vcco and comprising three inverters 82, 84 and 86, a capacitor 88 and an input transistor 90. Input transistor 90 receives the recir signal as input and is connected, on output, to a node 92. Node 92 is also connected to the output of inverter 82 and to the input of inverter 84. The output of inverter 84 is connected to a node 94 which is connected to the input of both inverters 82 and 86. Capacitor 88 is connected in parallel to node 94.

As mentioned hereinabove, the recir signal follows the voltage level of the main power supply Vcc until a certain voltage level T above which the recir signal drops back to a zero voltage level.

Before the main supply Vcc ever powers up, the switched signal Vcco carries either the battery supply Vbat or no supply if the battery has not yet been inserted. Since the recir signal follows the main power supply Vcc, the recir signal is at zero voltage and thus, the input transistor 90 is inactive. This remains true even during battery insertion since the recir signal is a function of the main power supply Vcc and not of the switched power supply Vcco.

Once the battery has been inserted and switched power supply Vcco carries its voltage, latch 80 could carry any voltage value since its input signal (from transistor 90) is not yet defined. However, since capacitor 88 has not yet been charged, it will store any charge floating within the ring of inverters 82 and 84, thereby pulling node 94, to which it is connected, to a low level. Thus, latch 77 will produce a high output signal (since output inverter 86 inverts the value of node 94). Accordingly, first power up transfer switch 79 (FIG. 5) is inactive, thereby keeping the switched power signal Vcco away from the SRAM 16 and saving on battery power.

When main supply Vcc powers up, the voltage level of the recir signal increases and, at one point, activates the input transistor 90. Since input transistor 90 is considerably larger than the p-channel transistor of inverter 82, the voltage drop across input transistor 90 pulls node 92 low. Inverter 84 inverts node 92, thereby making node 94 high. Because node 94 is high, the output of inverter 86, which is the output of the power up latch 77, is low, thereby activating first power up transfer switch 79.

As main supply Vcc continues to power up, the recir signal returns to zero. However, this does not affect latch 77 since it does not change the low state of node 92. Thus, latch 77 maintains the correct state, continually providing a low signal to first power up transfer switch 79. Thus, first power up transfer switch 79 remains activated and the switched power signal Vcco continues to be transferred to the now activated SRAM 16 (FIG. 1).

It is noted that the n-wells of all of the p-channel transistors (FIG. 6) are powered by the Vcco source.

It will be appreciated by persons skilled in the art that the present invention is not limited to what has been particularly shown and described hereinabove. Rather the scope of the present invention is defined only by the claims which follow:

I claim:

1. A switching circuit for switching between a main power supply and a battery power supply only after first power up, the switching circuit comprising:

a switch connected on input to said main and battery power supplies for switching therebetween and for providing one of said main and battery power supplies to a switched power supply node;

a first power-up transfer transistor connected on input to said switched power supply node and having a gate; and a first power up latch, powered by a switched power supply from said switched power supply node and connected on output to said gate of said first power-up transfer transistor, said first power up latch producing an activation signal to said gate upon and after first power up of said main power supply.

2. A switching circuit according to claim 1 and wherein said first power up latch comprises:

a latch formed of first, second and third inverters, wherein said first and second inverters are connected in a ring and said third inverter is connected to an output node of said ring;

a capacitor connected to said output node of said ring, said capacitor forcing said latch to store a high value prior to first power up; and a controlling transistor connected to an input node of said ring and providing an active signal whenever said main power supply is below said predetermined minimum voltage level, wherein, upon activation, said controlling transistor provides said latch with a low value.

3. A switching circuit according to claim 2 and comprising a low power sensing circuit for sensing when said main power supply is below said predetermined minimum voltage level and for providing an activation signal to said controlling transistor in response.

* * * * *